US006556388B1

(12) United States Patent
Everitt et al.

(10) Patent No.: US 6,556,388 B1
(45) Date of Patent: Apr. 29, 2003

(54) DIFFERENTIAL VGMR SENSOR

(75) Inventors: Brenda Anne Everitt, Minneapolis, MN (US); Taras Grigorievich Pokhil, Arden Hills, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/600,270

(22) PCT Filed: Oct. 6, 1999

(86) PCT No.: PCT/US99/23119
§ 371 (c)(1),
(2), (4) Date: Jul. 13, 2000

(87) PCT Pub. No.: WO00/30077
PCT Pub. Date: May 25, 2000

Related U.S. Application Data

(60) Provisional application No. 60/116,763, filed on Jan. 22, 1999, and provisional application No. 60/109,288, filed on Jan. 18, 1998.

(51) Int. Cl.[7] .................................................. G11B 5/39
(52) U.S. Cl. ..................................................... 360/314
(58) Field of Search ................................. 360/314, 324, 360/324.1, 324.11, 324.12; 338/32 R; 324/252

(56) References Cited

U.S. PATENT DOCUMENTS

| 5,442,508 A | 8/1995 | Smith |
| 5,576,914 A | 11/1996 | Rottmayer et al. |
| 5,576,915 A | 11/1996 | Akiyama et al. |
| 5,583,725 A | 12/1996 | Coffey et al. |
| 5,701,222 A | * 12/1997 | Gill et al. ................... 360/314 |
| 5,716,719 A | 2/1998 | Saito et al. |
| 5,725,963 A | 3/1998 | Iwasaki et al. |
| 5,726,837 A | 3/1998 | Nakatani et al. |
| 5,738,946 A | 4/1998 | Iwasaki et al. |
| 5,748,399 A | 5/1998 | Gill |
| 5,751,521 A | * 5/1998 | Gill ............................. 360/314 |
| 5,818,685 A | 10/1998 | Thayamballi et al. |
| 5,825,595 A | 10/1998 | Gill |
| 5,828,525 A | * 10/1998 | Iwasaki et al. ............. 360/314 |
| 5,858,455 A | 1/1999 | Chambliss et al. |
| 5,859,753 A | * 1/1999 | Ohtsuka et al. ............ 360/314 |
| 5,859,754 A | * 1/1999 | Tong et al. .................. 360/314 |
| 5,869,963 A | * 2/1999 | Saito et al. ................. 324/252 |
| 6,392,849 B2 | * 5/2002 | Maruyama et al. ......... 360/314 |

FOREIGN PATENT DOCUMENTS

JP          07-21530      *   1/1995

OTHER PUBLICATIONS

Daughton, James M., "Weakly Coupled GMR Sandwiches", Mar. 1994, IEEE Transactions on Magnetics, vol. 30, No. 2, MN.
International Search Report.

* cited by examiner

Primary Examiner—David L. Ometz

(57) ABSTRACT

A Vertical Giant Magnetoresistive Sensor (VGMR) with two VGMR structures (61 A, 61 B), each responding differently to an external magnetic field, producing a differential signal proportional to the field. The magnetizations (M1, M1', M2, M2') in each of the sensors are oriented antiparallel. The antiparallel magnetization is attained by altering the magnetic compositions of the two structures, or adding an additional structure such as a permanent magnet or current strip (11) between the VGMR structures.

19 Claims, 19 Drawing Sheets

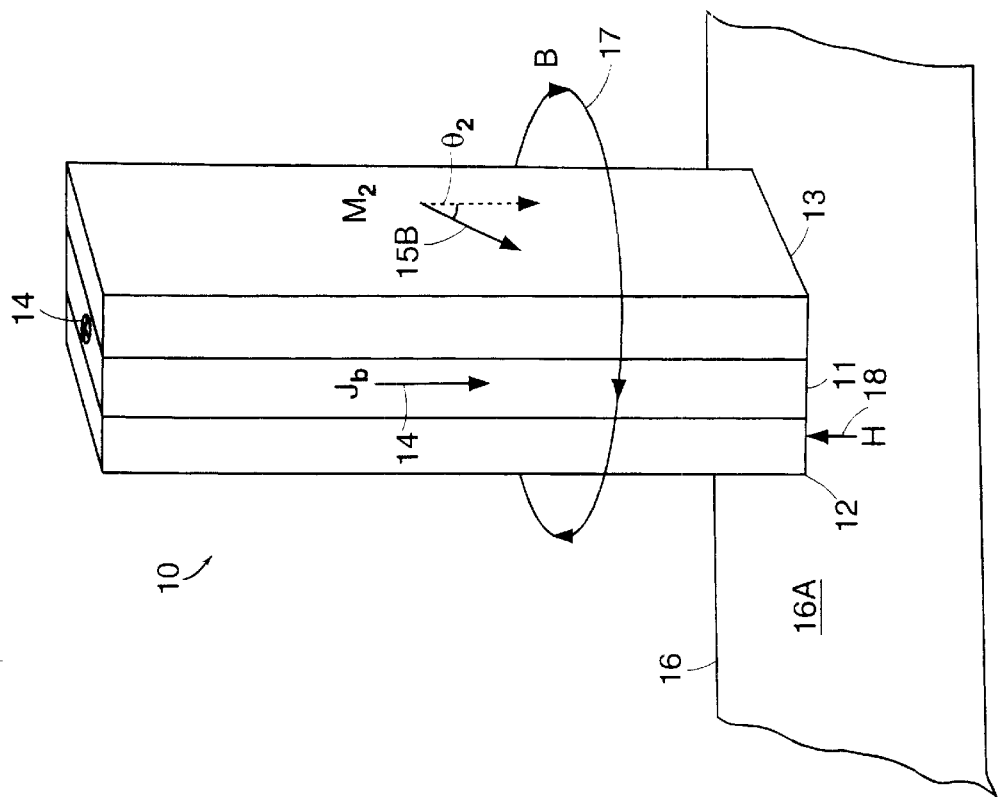
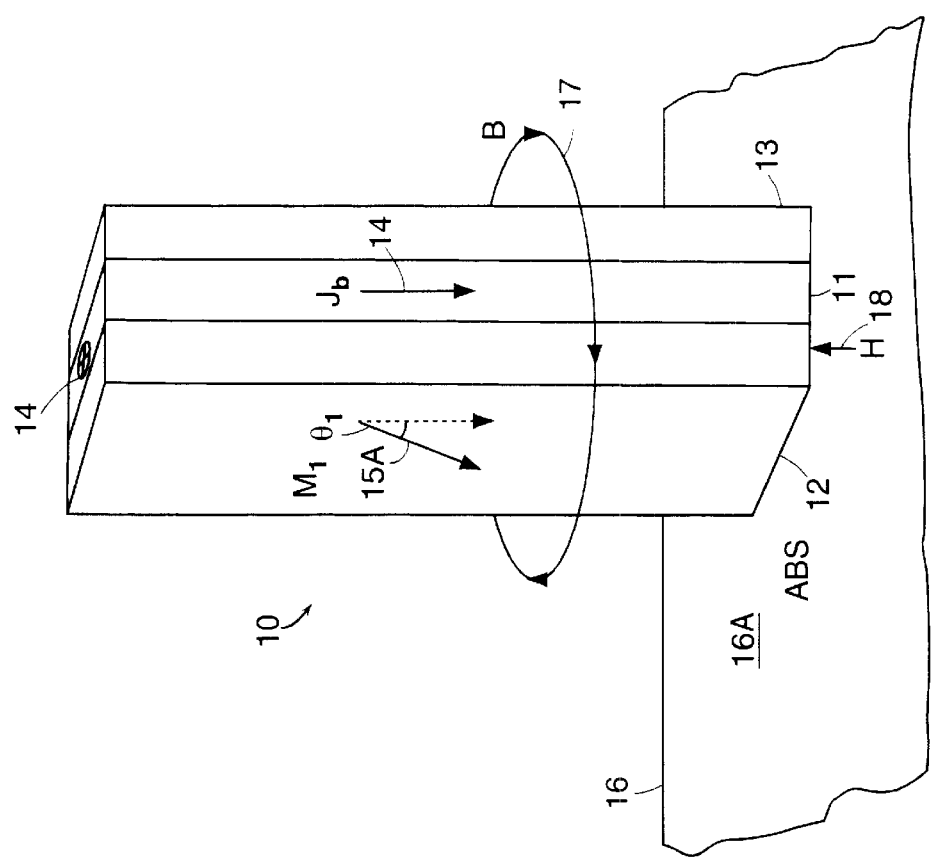
FIG. 1A
PRIOR ART
FIG. 1B
PRIOR ART

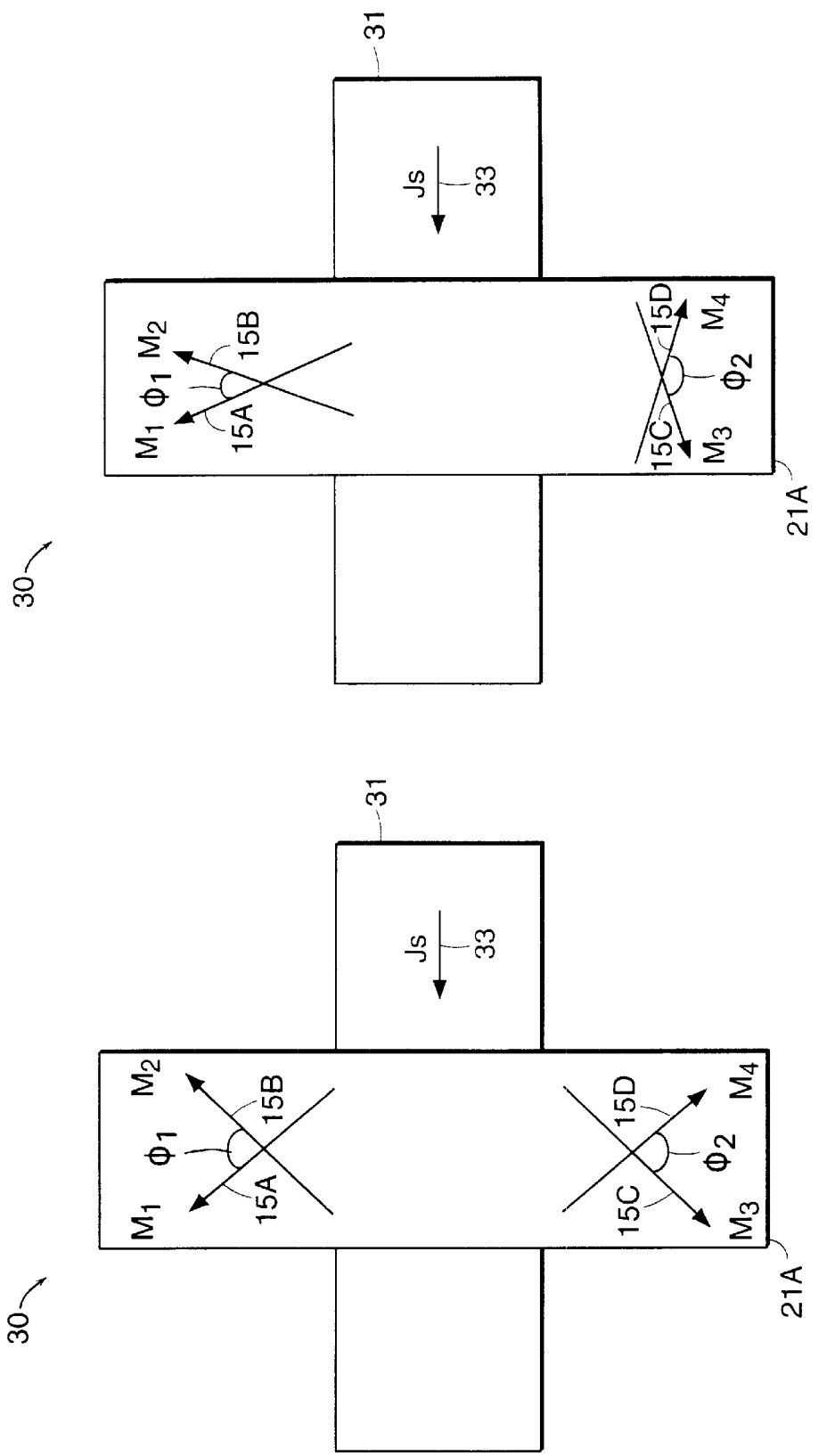

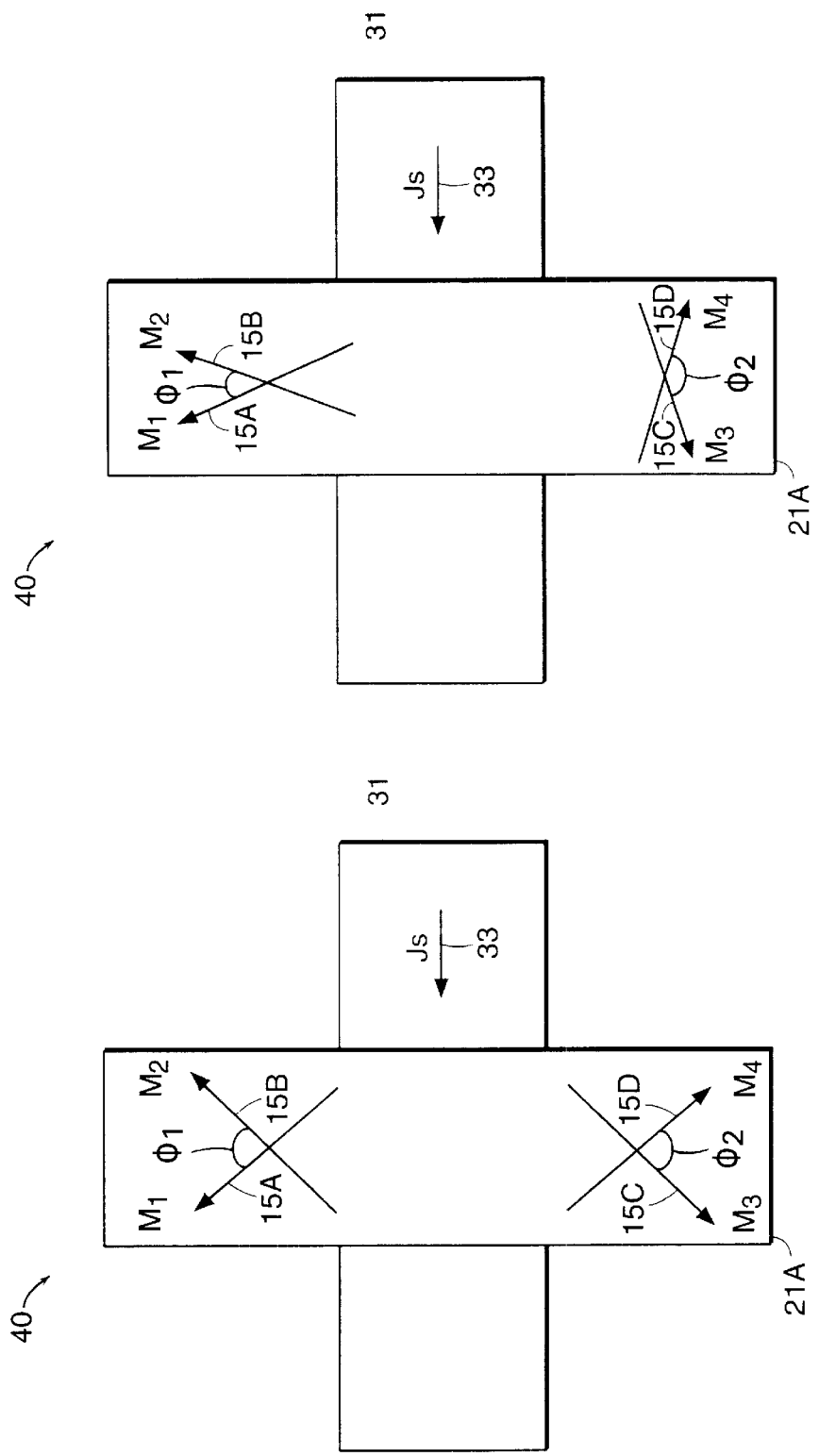

DIFFERENTIAL VGMR SENSOR

This application claims benefit of the filing date of U.S. Provisional Application Serial No. 60/116,763, filed Jan. 22, 1999, and U.S. Provisional Application Serial No. 60/109,288, filed Nov. 18, 1998.

The invention relates to magnetic recording heads and more specifically to a differential VGMR sensor.

BACKGROUND OF THE INVENTION

The change in resistance caused by a magnetic field is called magnetoresistance. This phenomena has been exploited in recording head technology, for example, in computer mass storage devices such as tape and disk drives. Magnetoresistive recording heads are well known to be useful in reading back data from a magnetic media mass storage device such as a disk drive or magnetic tape drive. A magnetoresistive ("MR") sensor detects magnetic field signals by measuring changes in the resistance of an MR element, fabricated of a magnetic material. Resistance of the MR element changes as a function of the strength and direction of magnetic flux being sensed by the element. Changes in resistance are then converted to determine the flux radiated from the magnetic medium. This measurement determines the signal stored on the medium.

Conventional MR sensors operate on the basis of the anisotropic magnetoresistive effect ("AMR") in which a component of the element's resistance varies as the square of the cosine of the angle between the magnetization vector of the MR element and the vector of a bias or sense current through the element:

$$\rho = \rho_o + D_\rho \cos^2\theta$$

where $D_{92}$ is the component of resistance of interest and $\rho_o$ is the base resistance of the MR element.

A variety of multilayered structures demonstrate significantly greater sensitivity to magnetic fields from the recording medium. This effect is known as the giant magnetoresistive ("GMR") effect. One type of sensor based on the GMR effect is called a vertical GMR ("VGMR") sensor.

The GMR effect is due to spin dependent scattering of electrons from two or more magnetic layers, separated by nonmagnetic spacer layers.

As systems are pushed to higher read density, higher magnetic bit size or decreased recording media size, the available magnetic flux is decreased. In addition, sensitivity may be decreased from thermal noise. For example, while the head is flying over the disk surface, it may hit a particle (contamination). The energy of this collision will be dissipated in the form of heat causing the temperature of the head to increase, causing an increase in the resistance of the head ultimately resulting in a signal that may be even higher than the magnetic signal from a transition. In order to sense these smaller signals and increase areal density, read heads with greater sensitivities are needed.

SUMMARY OF THE INVENTION

Various implementations of the invention may include one or more of the following features.

In general, in one aspect, the invention feature an apparatus for reading data including a first magnetoresistive element, a second magnetoresistive element formed substantially parallel to the first magnetoresistive element, a nonmagnetic spacer interposed between the first and second magnetoresistive elements, wherein the first and second magnetoresistive elements are comprised of a first magnetic layer, a second magnetic layer formed substantially parallel to the first magnetic layer and a conductive spacer interposed between the first and second magnetic layers, wherein a bias current applied to the conductive spacer of the first magnetoresistive element is substantially equal and opposite to a bias current applied to the conductive spacer of the second magnetoresistive element.

In an implementation, the apparatus can further include a permanent magnet formed between the first and second magnetoresistive elements and adjacent the nonmagnetic spacer, a current strip formed between the first and second magnetoresistive elements and in between the nonmagnetic spacer and the permanent magnet, a current strip formed between the first and second magnetoresistive elements and adjacent the nonmagnetic spacer.

In an implementation, the first magnetic layer of at least one of the first and second magnetoresistive elements includes a first magnetic material, a second magnetic material, a spacing material interposed between the first and second magnetic materials.

In another implementation, the first and second magnetic materials are comprised of synthetic antiferromagnetics and the spacing material is ruthenium.

In another implementation, the second magnetic layer of at least one of the first and second magnetoresistive elements includes a first magnetic material, a second magnetic material, a spacing material interposed between the first and second magnetic materials.

In still another implementation, the first magnetic layer is a single layer, wherein the single layer can be comprised of at least one of NiFe, CoFe, and NiFeCo.

In yet another implementation, the apparatus of claim 1 wherein the first magnetic layer is a bilayer.

In another implementation, the apparatus further includes a first thin layer adjacent interposed between the first magnetic layer and the conductive spacer and a second thin layer interposed between the second magnetic layer and the conductive spacer, wherein the first and second thin layers can be comprised of at least one of Co and CoFe.

In another aspect, the invention features a VGMR sensor, including a first VGMR stack, a second VGMR stack and a nonmagnetic and nonconductive spacer interposed between the first and second VGMR stacks.

In an implementation, the first and second VGMR stacks includes a first SAF stack, a second SAF stack and a conductive spacer interposed between the first and second SAF stacks.

In another implementation, each of the first and second SAF stacks includes a first SAF layer, a second SAF layer and a spacer layer interposed between the first and second SAF layers, wherein the conductive spacer can be copper.

In another implementation, a current source to apply a first bias current to the first VGMR stack and a second bias current to the second VGMR stack are included.

In another implementation, the VGMR sensor can include a differential amplifier for summing the first and second bias currents and a detector for detecting changes in the first and second magnetizations.

In another aspect, the invention features a differential GMR sensor, including a plurality of spaced GMR stacks and means for biasing the magnetization of respective stacks to respond to external magnetic fields by increasing resistance in one stack and decreasing resistance in adjacent stacks.

The invention may provide one or more of the following advantages.

A differential VGMR sensor provided with two VGMR sensors which respond differently to an external field, thus producing a differential signal proportional to the field are provided. The sensor produces a better signal-to-noise ratio compared with a standard VGMR sensor. This better signal-to-noise ratio increases the read density of the sensor.

The details of one or more embodiments are set forth in the accompanying drawings and the description below. Other features, objects, and advantages of the invention will be apparent from the description and the drawings, and from the claims.

BRIEF DESCRIPTION OF THE DRAWINGS

FIG. 1A is a perspective view of a conventional VGMR sensor.

FIG. 1B is a perspective view of a conventional VGMR sensor.

FIG. 3C is a side view of a differential VGMR sensor of FIGS. 3A and 3B.

FIG. 3D is a side view of a differential VGMR sensor of FIGS. 3A and 3B in the presence of a magnetic field.

FIG. 4C is a side view of a differential VGMR sensor of FIGS. 4A and 4B.

FIG. 4D is a side view of a differential VGMR sensor of FIGS. 4A and 4B in the presence of a magnetic intensity.

DETAILED DESCRIPTION

Figure 1C:
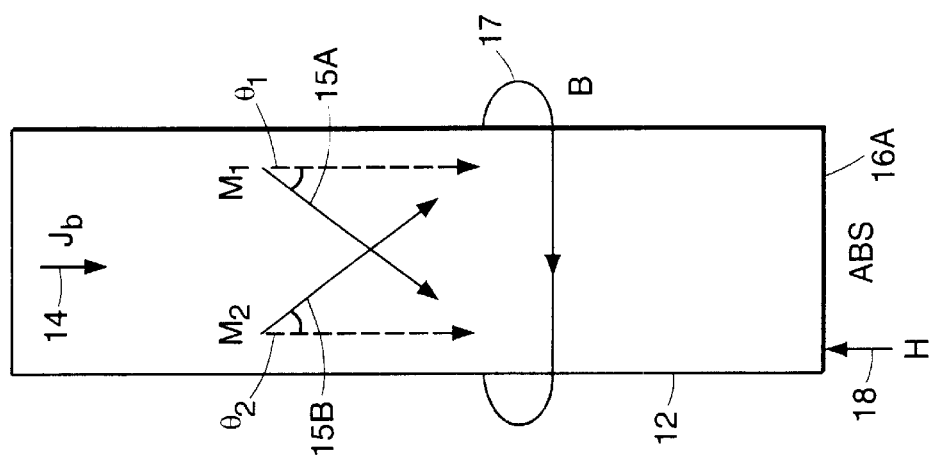
FIG. 1C is a side view of a conventional VGMR sensor.

FIGS. 1A, 1B, and 1C are alternate perspective side views of a conventional Giant Magnetoresistive (GMR) stack 10. Referring to FIG. 1A, the conventional sandwiched GMR 10 is typically comprised of a conductive spacer material 11, such as copper, sandwiched in between two magnetic layers or bilayers 12, 13 such as NiFe, CoFe, and NiFeCo. A bias or sensing current density $J_b$ as depicted by a vector 14 runs through the GMR stack 10 via the conductive spacer 11. Referring to FIGS. 1A and 1B, the magnetic layers 12, 13 have a magnetization $M_1$ and $M_2$ represented by vectors 15A and 15B. The magnetization vectors 15A and 15B are shown in two orientations represented by a solid and a dashed line. In the absence of bias current density 14, the magnetization vectors 15A, 15B orient themselves perpendicular to an air bearing surface 16A (ABS) which is the surface of the head facing recording media 16. The perpendicular orientation is due to the inherent anisotropic properties of the magnetic layers 12, 13.

In the presence of the bias current density 14, a resultant magnetic field B has a vector 17 that "curls" around the current density vector 14. This magnetic field B acts in opposite directions on each of the two magnetic layers 12 and 13. Consequently, the magnetization vectors 15A and 15B of the magnetic layers 12, 13 will orient themselves in the direction of the magnetic field vector 17, which is the direction of the magnetic flux created by the field B. As a result, angles $\theta_1$ and $\theta_2$ are formed between the magnetization vectors 15A and 15B and a vector 18 normal to the ABS 16A. A further result is that the magnetization vectors 15A and 15B form a scissoring orientation with respect to each other as shown in FIG. 1C.

The function of the bias current density 14 is to provide an output signal and assist in biasing the sensor in its sensitive operating regime. Resistance depends on the angle between magnetization directions in the magnetic layers. As the magnetization of the magnetic layers changes direction as it senses the magnetic flux from the recording medium, its-resistance will change. Therefore when a magnetic field density H represented by a vector H radiates from the magnetic medium 16 the magnetization vectors will attempt to align themselves with that field. Consequently, as the vector 18 varies in its intensity, the magnetization vectors 15A and 15B will change their orientation. There will be a corresponding change in resistance due to the GMR effect, which will be indicated by a change in the bias current density 14. These changes in resistance are measured and a signal is obtained. This embodiment describes GMR detection.

Figure 2:
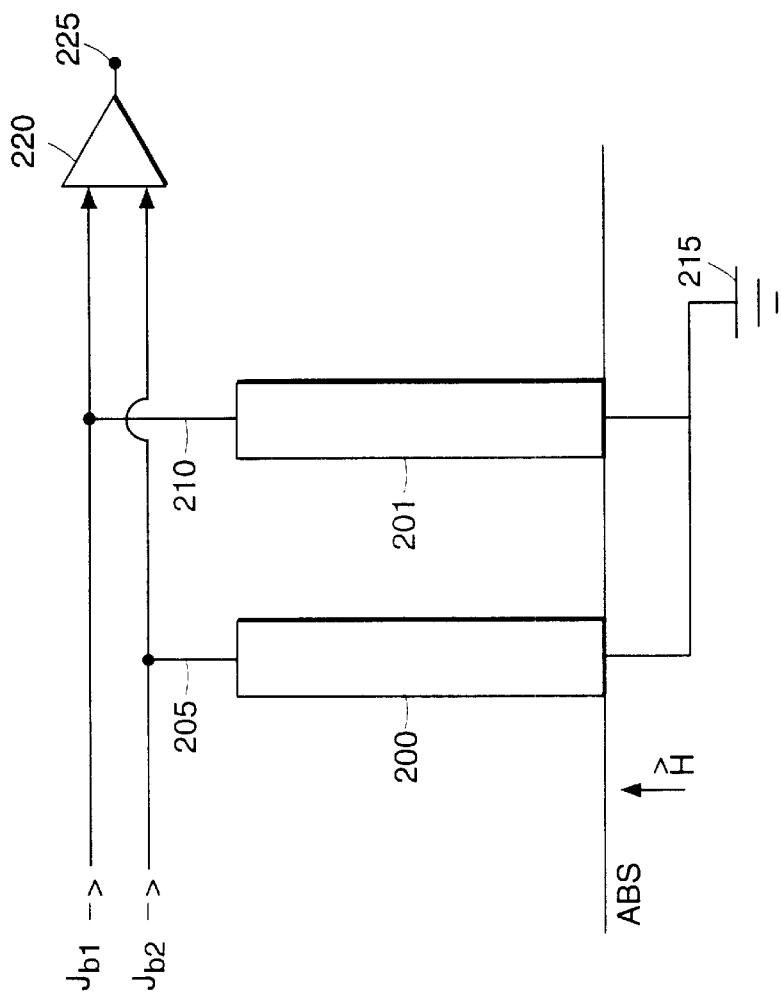
FIG. 2 is a schematic diagram of an implementation of two VGMR sensors producing a differential signal output.

FIG. 2 illustrates a schematic diagram of two differential VGMR sensors 200, 201 biased by bias current densities $J_{b1}$ and $J_{b2}$ respectively through lines 205 and 210 respectively, with a common ground 215. The resultant change in the bias currents that result from an increase (decrease) in resistance of one VGMR sensor 200, and a decrease (increase) of resistance in the other VGMR sensor 201 are combined at differential amplifier 220 to produce differential signal 225.

Figure 2A:
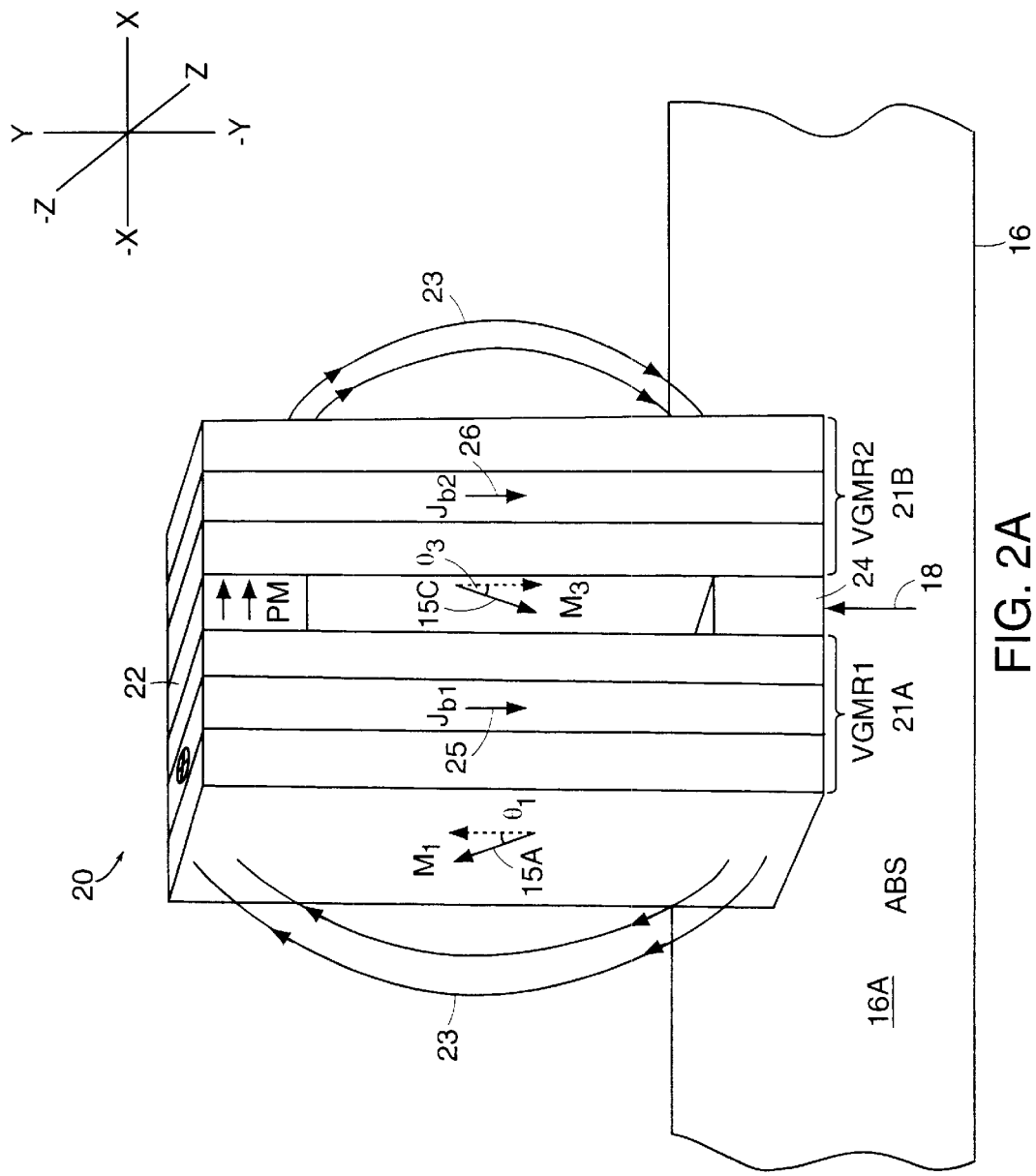
FIG. 2A is a perspective view of a differential VGMR sensor utilizing a permanent magnet.

FIG. 2A depicts an implementation having two VGMR sensors connected in parallel. The magnetizations of a first VGMR sensor VGMR1 21A and a second VGMR sensor VGMR2 21B are oriented in opposite directions. An external magnetic field from a recording medium applied perpendicular to the ABS will cause an increase/decrease of the angle between the magnetization directions in the magnetic layers of VGMR1 and a corresponding decrease/increase in the magnetization directions of the magnetic layers in VGMR2.

FIG. 2A depicts a differential VGMR sensor 20 with a permanent magnet 22 and a nonmagnetic spacer 24 sandwiched between a first VGMR stack 21A ("VGMR1") and a second VGMR stack 21B ("VGMR2"). A Cartesian coordinate system has been added to the figure for ease of discussion. The nonmagnetic spacer 24 is thick enough so as not to cause ferromagnetic orange peel coupling between the adjacent magnetic layers of VGMR1 and VGMR2. Orange peel coupling is due to the topography of the GMR stack itself giving rise to parallel coupling between the magnetic layers in the GMR stack. The nonmagnetic spacer is typically 10–40 Angstroms but is not limited to this thickness. The spacer 24 is located near the ABS edge 16A of VGMR1 21A and VGMR2 21B. The permanent magnet 22 is located away from the ABS 16A edge in order to prevent disruption of the recording medium 16 and to prevent a decrease in sensitivity of the sensor 20. The magnetization of the permanent magnet 22 is directed parallel to the ABS and normal to the VGMR layers 21A and 21B. The presence of the permanent magnet 22 is to achieve opposite magnetizations in VGMR 21A and VGMR2 21B. A magnetic field vector 23 from the permanent magnetic 22 will orient the magnetization vectors 15A, 15B (see FIG. 2B) in VGMR1 21A and 15C, 15D (see FIG. 2B) in VGMR2 21B in the opposite directions. As seen in FIG. 2A, the magnetic flux from the permanent magnet 23 is generally directed in the y direction with respect to VGMR1 21A and in the –y direction with respect to VGMR2 21B. Thus the magnetization vectors 15A, 15B of VGMR1 21A will orient themselves along the field lines of vector 23 in the y direction. In contrast, the magnetization vectors 15C, 15D of VGMR2 21B will orient themselves along the field lines of vector 23 in the –y direction. Then, in the presence of bias currents 25, 26 in each of VGMR1 21A and VGMR2 21B respectively, the magnetizations of the respective layers of VGMR1 21A and VGMR2 21B will scissor with respect to each other (ie $M_1$ 15A scissors with $M_2$ 15B and $M_3$ 15C scissors with $M_4$ 15D).

Figure 2B:
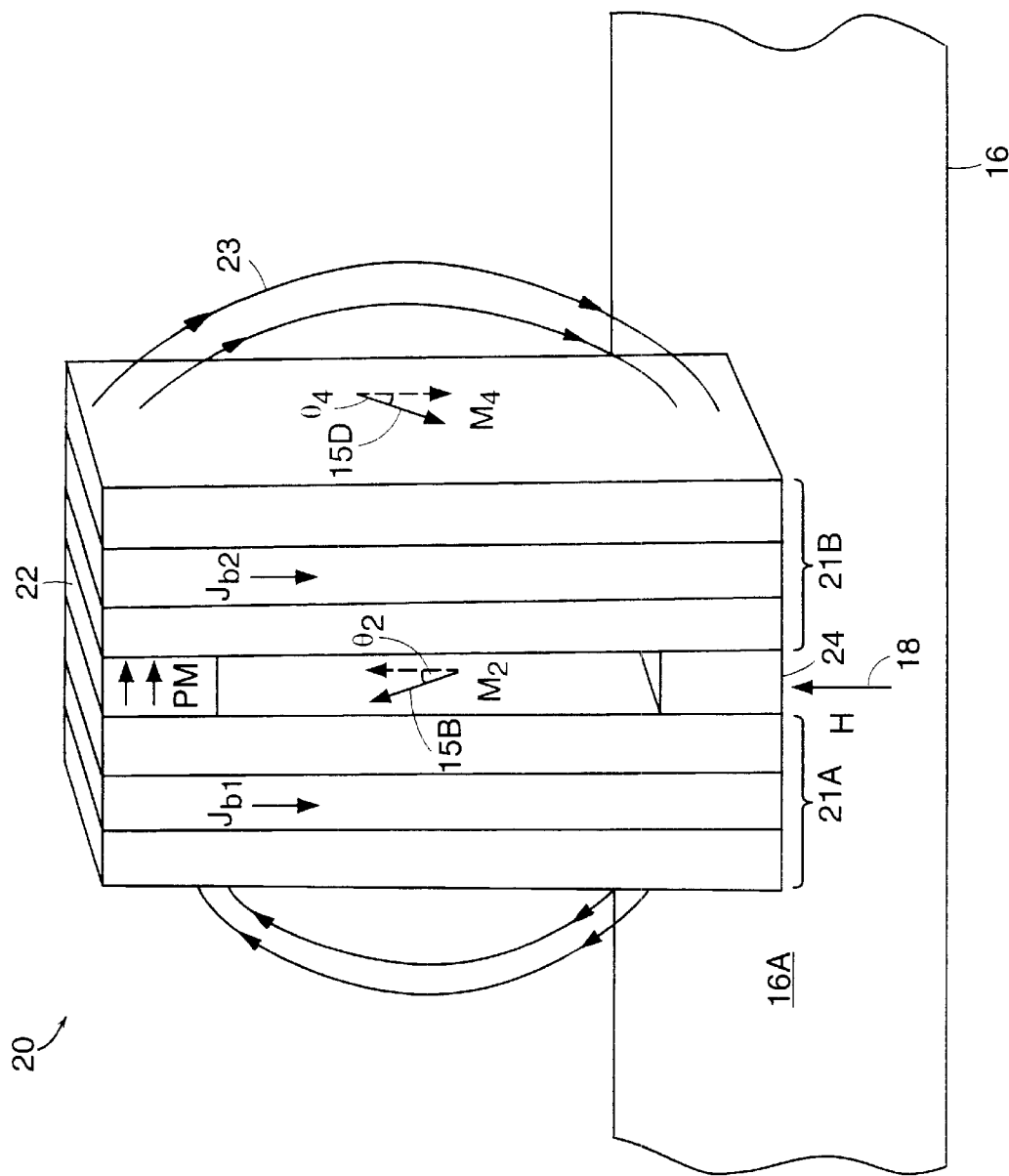
FIG. 2B is a perspective view of a differential VGMR sensor of FIG. 2A.
Figure 2D:
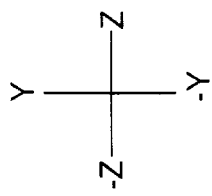
FIG. 2D is a side view of a differential VGMR sensor of FIGS. 2A and 2B in the presence of a magnetic field.
Figure 2D:
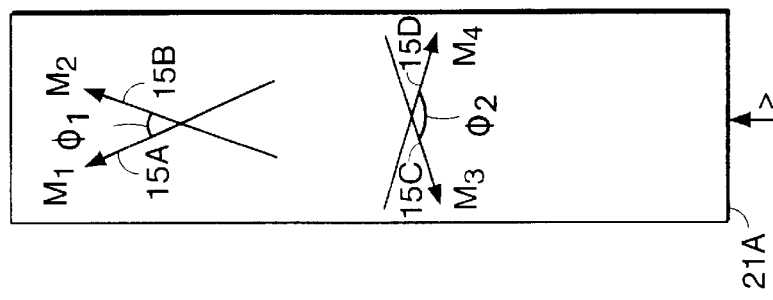

Referring now to FIG. 2D, in the presence of a magnetic field density H represented by vector 18 from a recording medium 16 perpendicular to the ABS 16A, all magnetizations will attempt to align themselves in the direction of the recording medium magnetic flux along vector 18 in the y direction. In the FIG. 2D, $M_1$ 15A and $M_2$ 15B will decrease the angle $\phi_1$ between them, and $M_2$ and $M_4$ will increase the angle $\phi_2$ between them as all magnetization vectors attempt to align themselves in the y direction.

As a result of the change in the magnetization directions in VGMR1 21A and VGMR2 21B there will be a corresponding change in resistance in each of VGMR1 21A and VGMR2 21B. As stated above, as the magnetization vectors 15A, 15B, 15C, 15D orient themselves in a direction antiparallel to each other, the resistance of the stacks will increase. As the magnetization vectors orient themselves parallel to each other, the resistance will decrease. Since the magnetizations in the VGMR stacks 21A, 21B have been oriented antiparallel due to the presence of the permanent magnet 22, one of the stacks will increase its resistance and one of the stacks will decrease its resistance as the field intensity of the vector 18 varies due to the GMR effect. As a result there will be a differential signal produced by the stacks. Since the layers are experiencing an opposite resistance change, the differential signal will be large in comparison to stacks that experience a corresponding resistance change. The resulting output signal will be further removed from the noise floor, thereby increasing the sensitivity of the VGMR sensor 20.

Figure 2C:
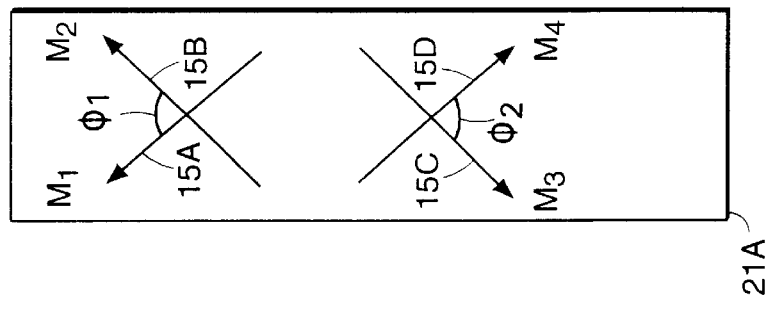
FIG. 2C is a side view of a differential VGMR sensor of FIGS. 2A and 2B.
Figure 3A:
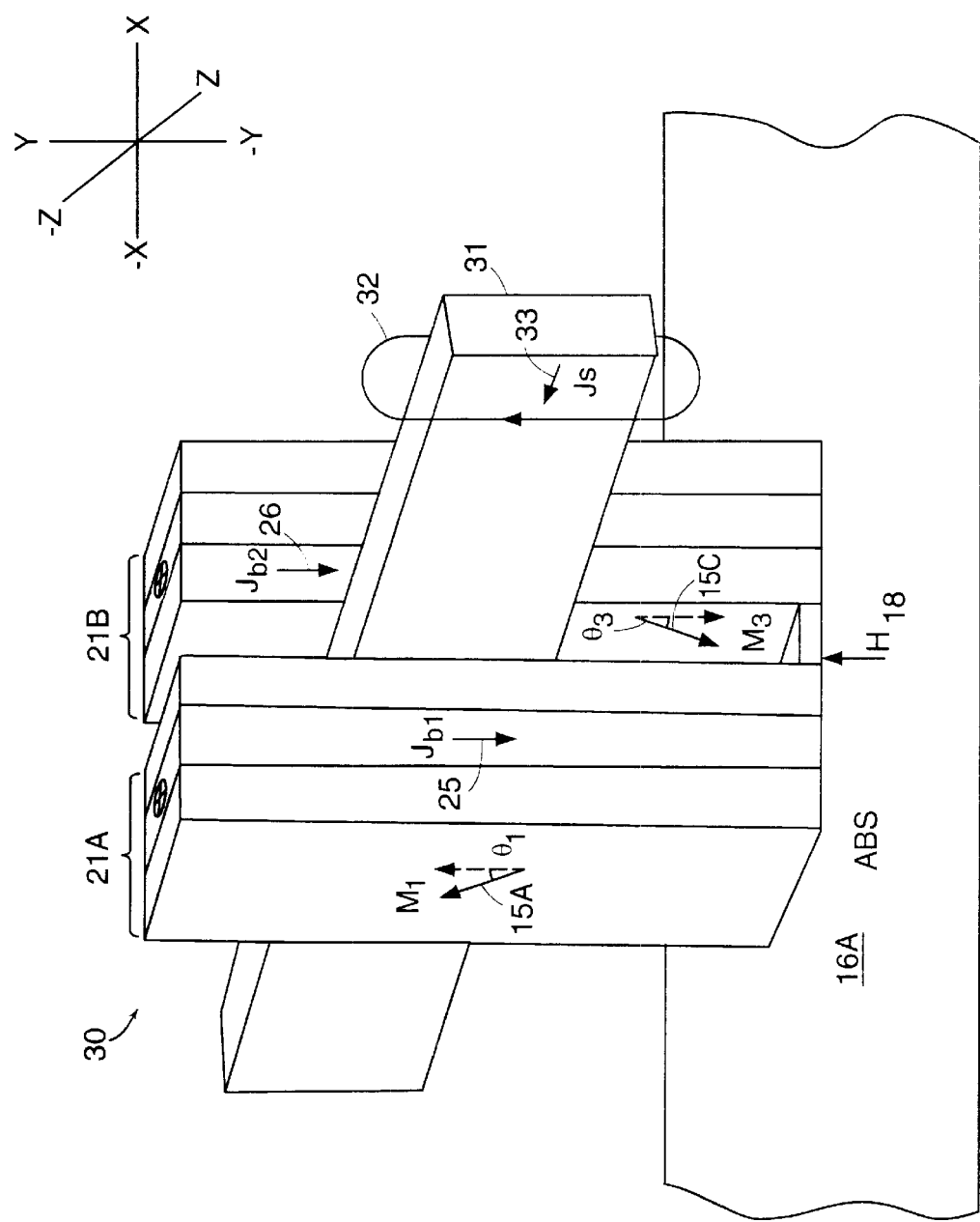
FIG. 3A is a perspective view of another implementation of a differential VGMR sensor utilizing a current strip.
Figure 3B:
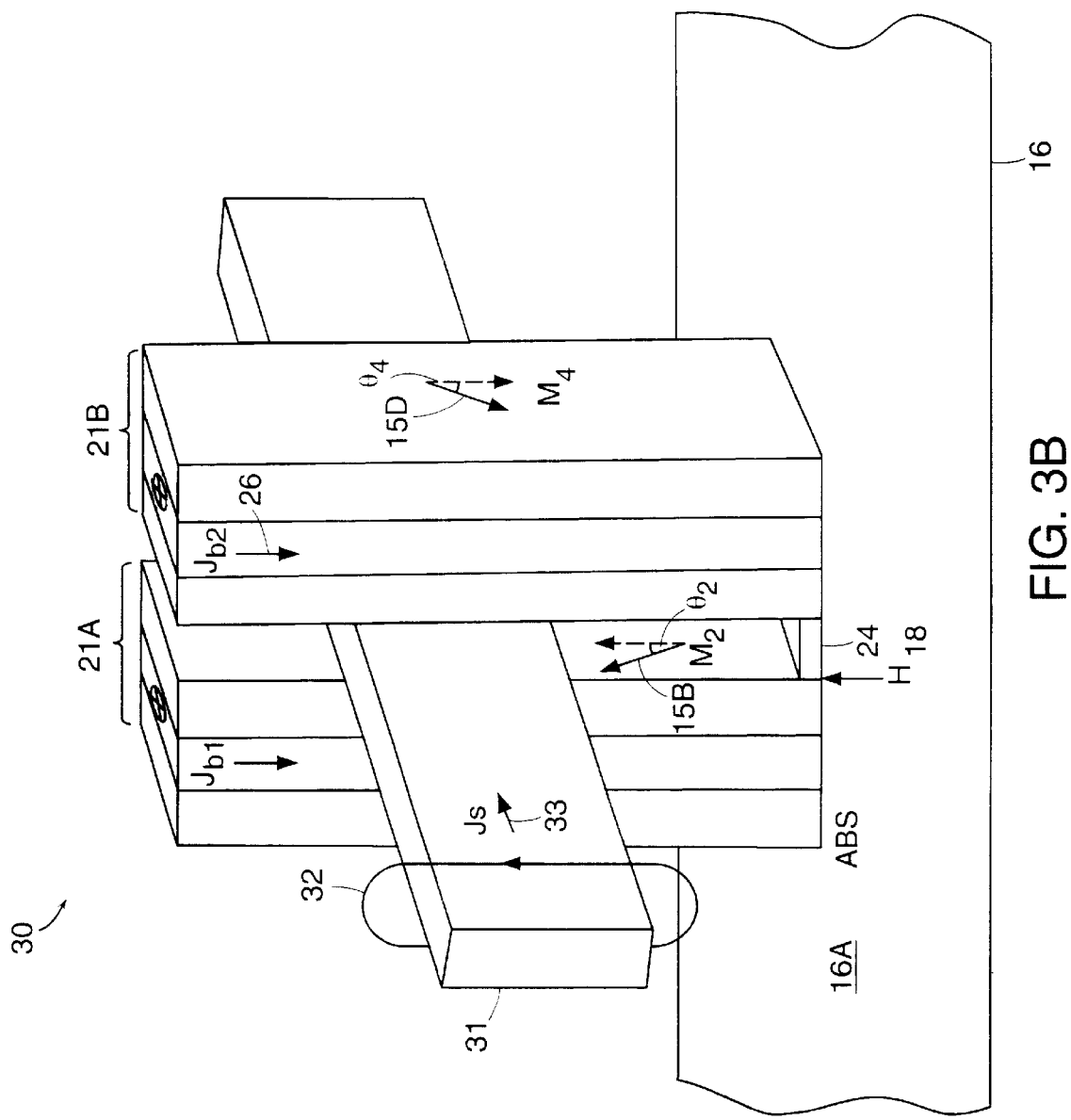
FIG. 3B is a perspective view of a differential VGMR sensor of FIG. 3A.

FIG. 3A depicts another implementation of a differential VGMR sensor 30 with a current strip 31 and a nonmagnetic spacer 24 sandwiched between VGMR1 21A and VGMR2 21B. In an implementation of the invention the current strip 31 provide[]s a magnetic flux from a magnetic field B represented by vector 32 having a similar effect to the flux caused by the permanent magnet (see FIGS. 2A, 2B, 2C). A current density $J_s$ runs through the strip 31 in the –z direction as indicated by the current density vector 33. The current strip creates the magnetic field 32 that curls around the strip 31 as indicated. The magnetic field B caused by the current strip 31 results in a field flux in one direction with respect to VGMR1 21A (generally in the y direction) and in the opposite direction with respect to VGMR2 21B (generally in the –y direction). Thus, the respective magnetizations of VGMR1 and VGMR2 will orient themselves in the opposite directions, $M_1$ 15A and $M_2$ 15B (FIG. 3B) in the y direction and $M_3$ 15C and $M_4$ 15D (FIG. 3B) in the –y direction. In this implementation the current strips orients the magnetizations 15A, 15B of VGMR1 21A and the magnetizations 15C, 15D of VGMR2 21B antiparallel to each other achieving the same effect as with the presence of a permanent magnet (FIGS. 2A, 2B, 2C). The use of bias current densities represented by vectors 25, 26 is the same as described above. The current densities 25, 26 cause a respective orientation of magnetization vectors 15A, 15B and 15C, 15D respectively.

Referring now to FIG. 3D, in the presence of a magnetic field density H represented by vector 18 from a recording medium 16 perpendicular to the ABS 16A, all magnetizations will attempt to align themselves in the direction of the recording medium magnetic flux along vector 18 in the y direction. In the FIG. 2D, $M_1$ 15A and $M_2$ 15B will decrease the angle $\phi_1$ between them, and $M_2$ and $M_4$ will increase the angle $\phi_2$ between them as all magnetization vectors attempt to align themselves in the y direction. The magnetic field H vector 18 from the magnetic medium 16 will cause variations in the magnetoresistance of the VGMR stacks 21A, 21B, ultimately creating a differential signal.

Figure 4A:
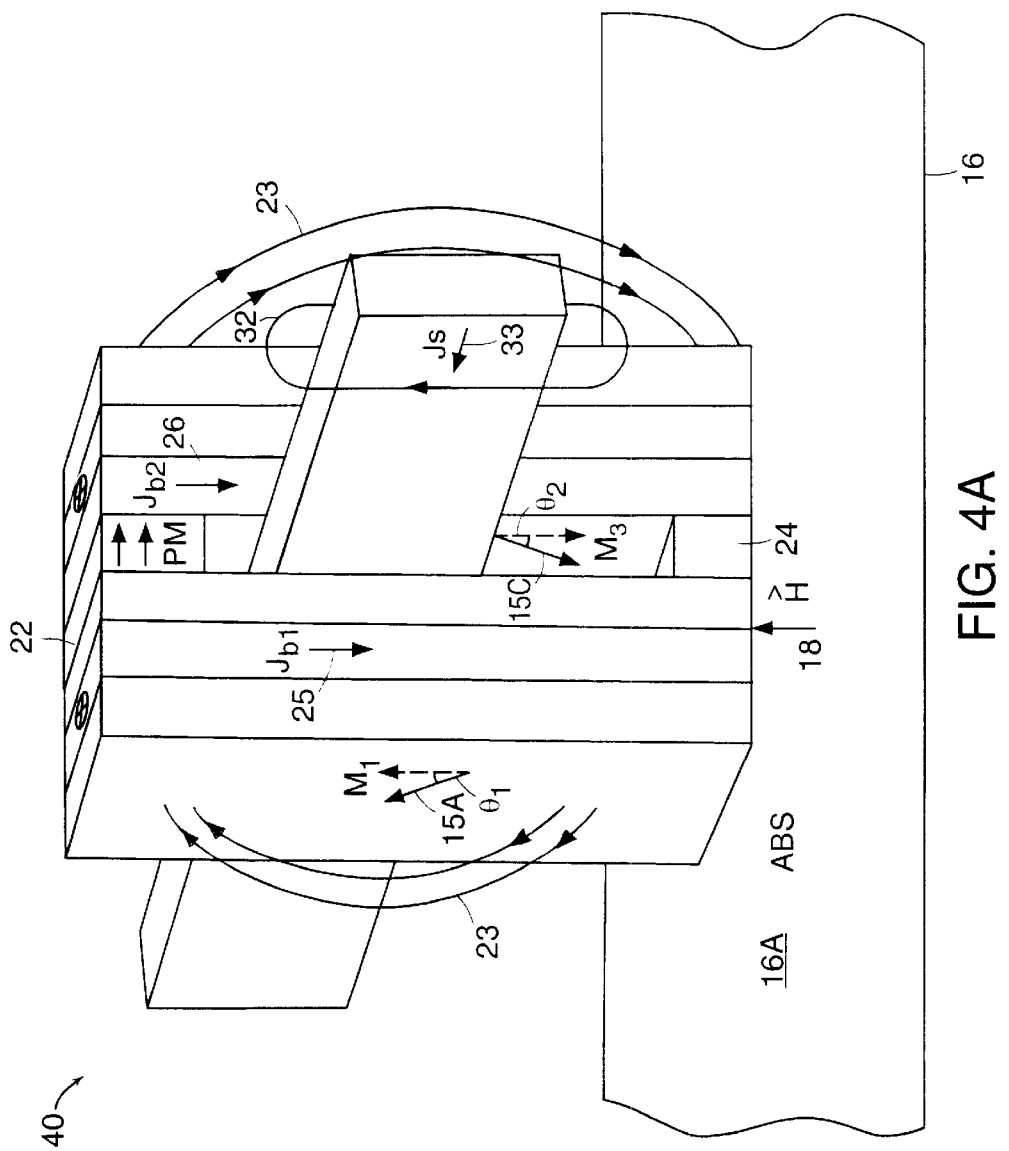
FIG. 4A is a perspective view of yet another implementation of a differential VGMR sensor utilizing a permanent magnet and a current strip.
Figure 4B:
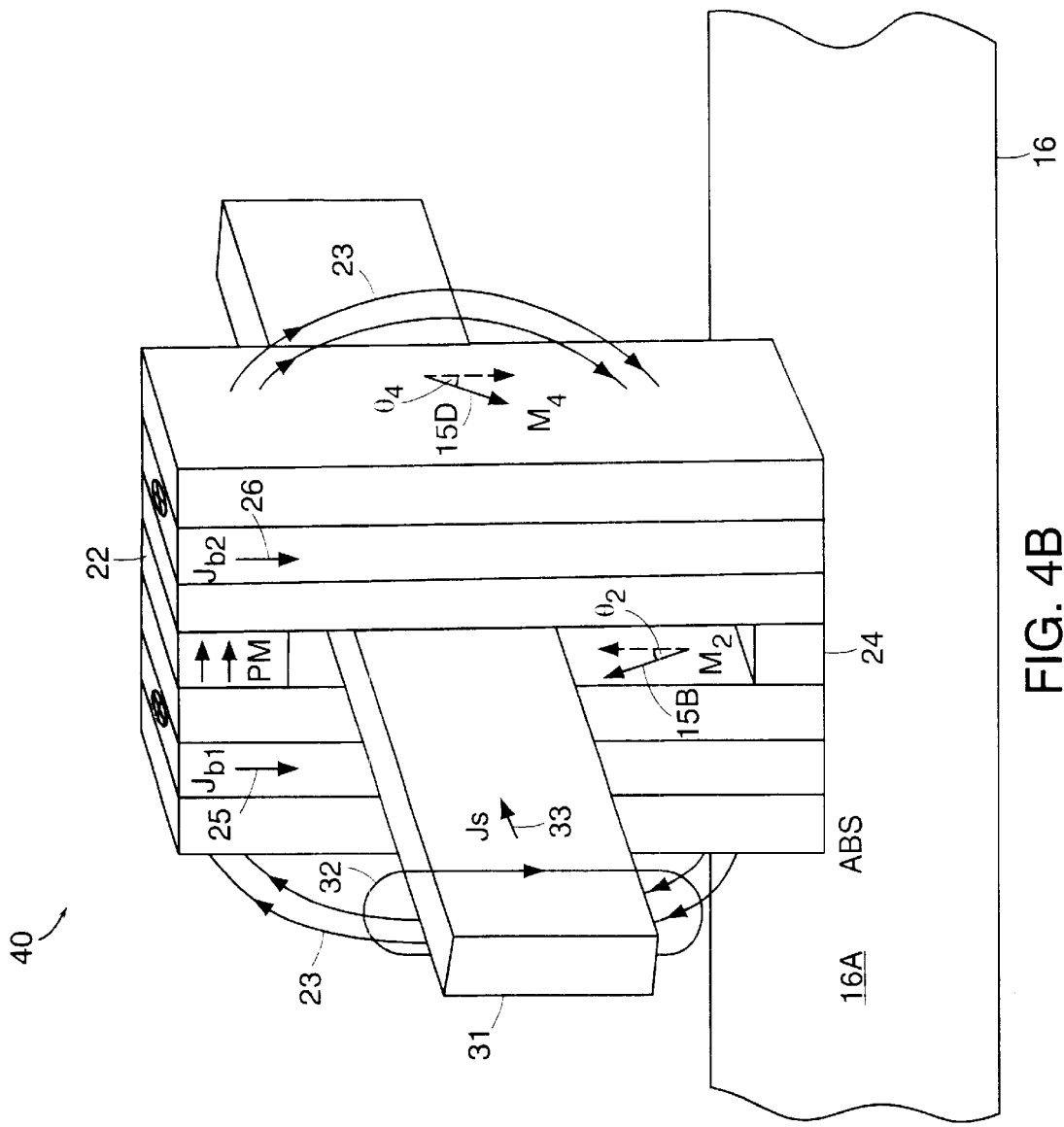
FIG. 4B is a perspective view of a differential VGMR sensor of FIG. 4A.

FIG. 4A depicts a differential VGMR sensor 40 with a current strip 31, a permanent magnet 22, and a nonmagnetic spacer 24 sandwiched between VGMR1 21A and VGMR2 21B. A current density $J_s$ runs through the strip 31 as indicated by the current density vector 33. The current 31 strip creates a magnetic field that curls around the strip represented by vector 32. The magnetic field B caused by the current strip 31 results in a field flux in one direction with respect to VGMR1 21A and in the opposite direction with respect to VGMR2 21B. Thus the respective magnetizations of VGMR1 21A and VGMR2 21B will orient themselves in the opposite directions. The permanent magnet is oriented away from the ABS edge. The magnetization of the permanent magnet 22 is oriented parallel to the ABS 16A and normal to the VGMR layers 21A, 21B. The magnetic field flux from the permanent magnetic 22 layer will orient the magnetization in the VGMR1 21A and the VGMR2 21B stripes in the opposite directions. In an implementation of the invention, the combination of fluxes from the respective B fields of the permanent magnet 22 and the current strip 31 represented by vectors 23 and 32 respectively, orient the magnetizations 15A, 15B (FIG. 4B) of VGMR1 21A and the magnetizations 15C, 15D (FIG. 4B) of VGMR2 21B in opposite directions, similarly to how the permanent magnet 22 or the current strip 31 would orient the magnetizations 15A, 15B, 15C, 15D alone.

Referring now to FIG. 4D, in the presence of a magnetic field density H represented by vector 18 from a recording medium 16 perpendicular to the ABS 16A, all magnetizations will attempt to align themselves in the direction of the recording medium magnetic flux along vector 18 in the y direction. In FIG. 2D, $M_1$ 15A and $M_2$ 15B will decrease the angle $\phi_1$ between them, and $M_2$ and $M_4$ will increase the angle $\phi_2$ between them as all magnetization vectors attempt to align themselves in the y direction. The magnetic field H vector 18 from the magnetic medium 16 will cause variations in the magnetoresistance of the VGMR stacks 21A, 21B, ultimately creating a differential signal. Once again the bias currents through the VGMR 21A, 21B stacks will sense the change in the resistance of the stacks as a field intensity H 18 varies from the medium 16.

Figure 5:
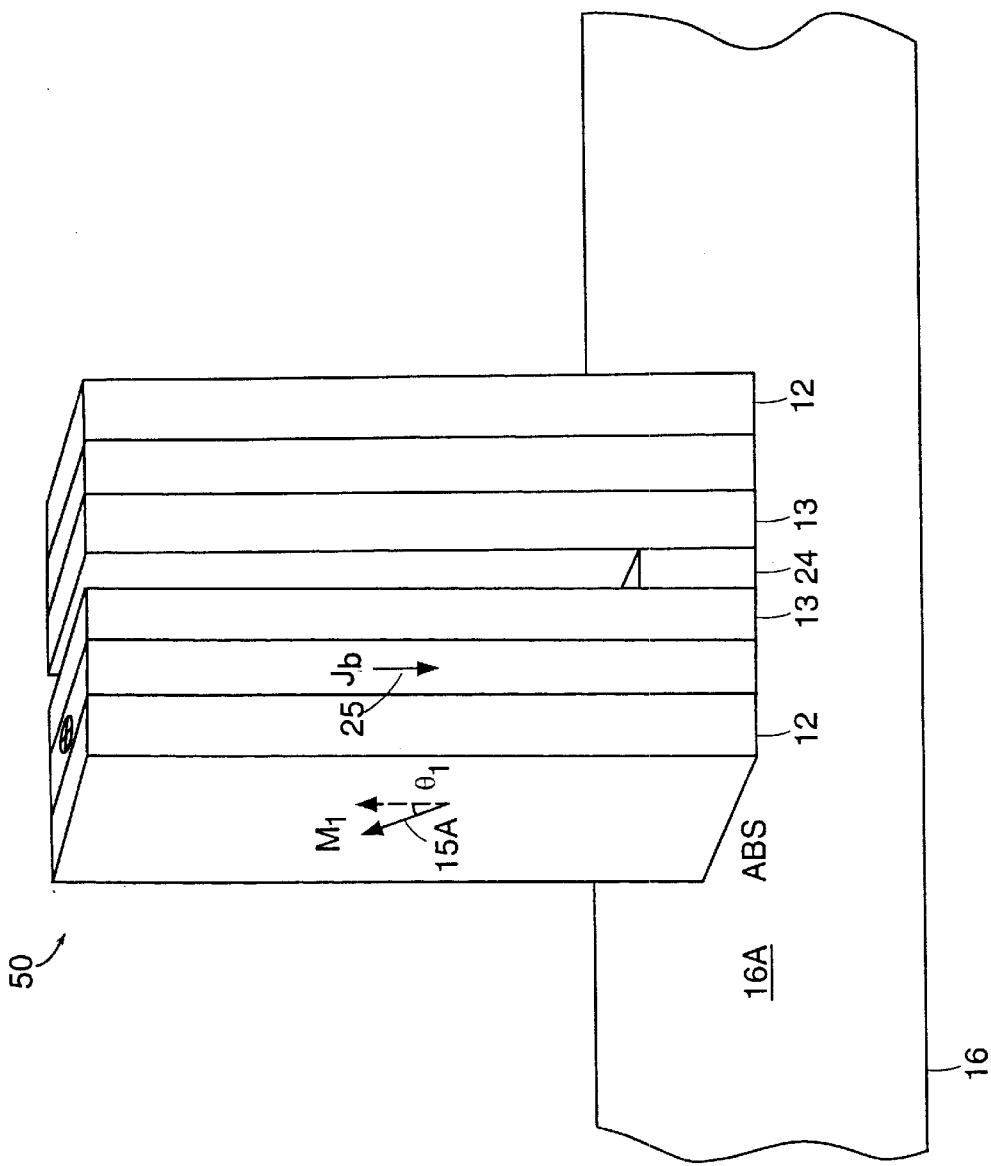
FIG. 5 is a perspective view of another implementation of a differential VGMR sensor utilizing a thin nonmagnetic spacer.

FIG. 5 depicts a Differential VGMR sensor 50 with a thin nonmagnetic spacer 24 sandwiched between VGMR1 21A and VGMR2 21B. The thin spacer 24 is located near the ABS 16A. At a certain thickness of the spacer 24, typically 7–9 D, there is exchange coupling between the magnetic layers 12, 13 of the VGMR sensors 21A, 21B. Exchange coupling is parallel or antiparallel magnetic coupling between magnetic layers separated by a nonmagnetic spacer. This exchange coupling between the magnetic layers 12,13 of VGMR1 21A and VGMR2 21B adjacent to the spacer 24 will have a negative value. The negative exchange coupling between the magnetic layers will orient the magnetization vectors 15A, 15B, 15C, 15D in the respective sensors 21A, 21B in the opposite directions. In an implementation, to avoid magnetic coupling and magnetic pinholes farther from the ABS the spacer 24 widens from 7–9 Angstroms to about 100–400 Angstroms.

In an implementation of the invention, the use of negative exchange coupling using a thin spacer can be used in conjunction with the permanent magnet 22 and the current strip 31.

In another embodiment of the invention the magnetizations of the two VGMR sensors are in opposite directions by changing the material composition of one of the sensors. In this embodiment the need for additional components such as the permanent magnet and the current strip are not necessary because the inherent magnetic qualities of the materials will orient the magnetizations. In this embodiment at least one of the stacks in the differential sensor incorporates synthetic antiferromagnetic ("SAF") layers.

Figure 6A:
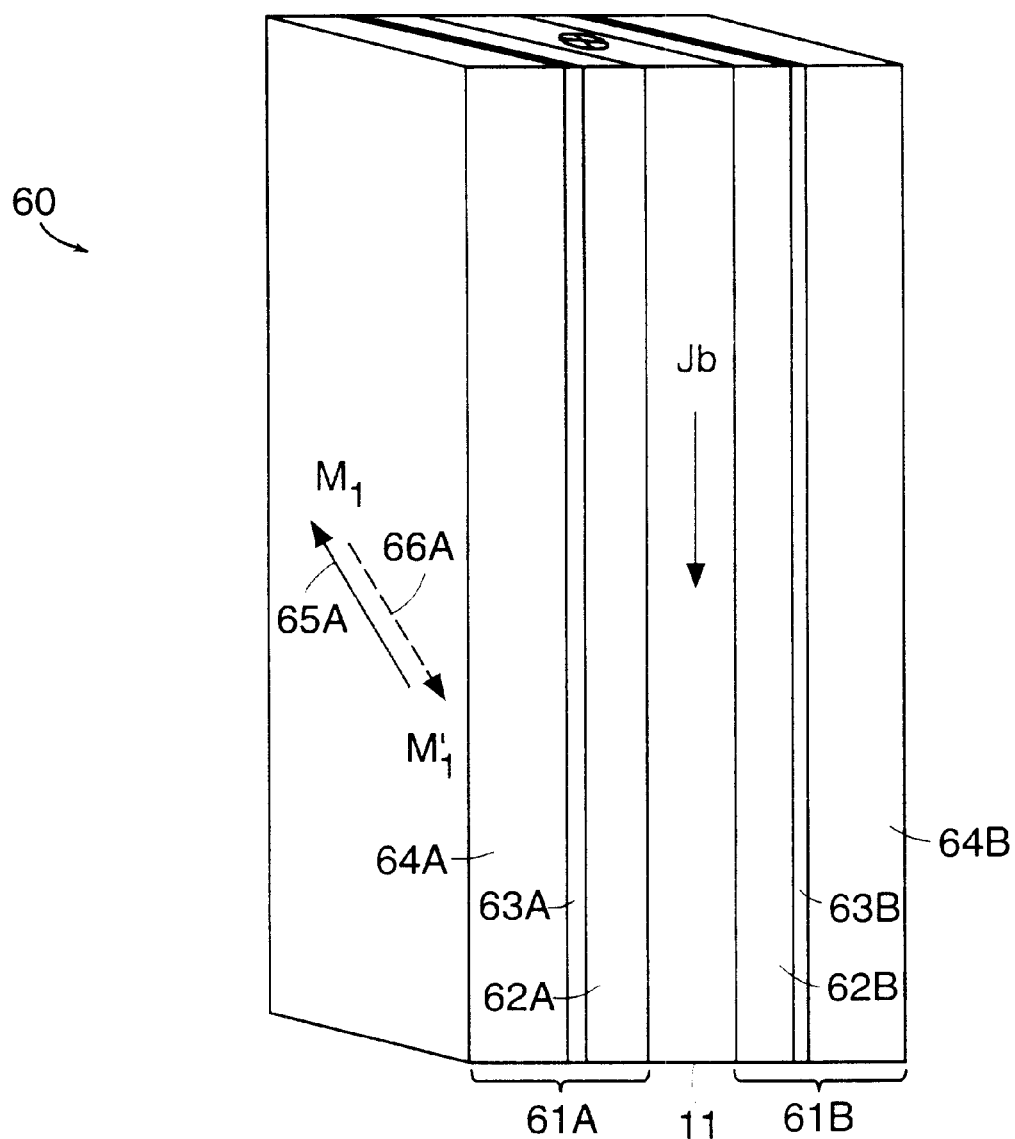
FIG. 6A is a perspective view of an enhanced differential VGMR stack.

FIG. 6A depicts an enhanced Differential VGMR sensor 60 with a conductive spacer 11 sandwiched between a first arrangement of SAF layers 61A and a second arrangement of SAF layers 61B. Both SAF arrangements 61A, 61B are comprised of a thin nonmagnetic spacer 63A, 63B sandwiched between a first SAF layer 62A, 62B located adjacent to the conductive spacer 11 and a thicker SAF layer 64A, 64B. The nonmagnetic spacers 63A, 63B can be any suitable nonmagnetic material such as ruthenium. The ferromagnetic material used in the layers 62A, 62B, 64A, 64B, which are antiferromagnetically coupled through the spacers 63A, 63B, produce a magnetic orientation in the absence of any magnetic field such as a permanent magnet 22 (see e.g. FIG. 2A), a current strip (see e.g. FIG. 3A), negative exchange coupling (see e.g. FIG. 5), or any combination thereof. In an implementation, the thicker outer layers 64A, 64B have a magnetization M1, M2 oriented in a first direction as represented by vectors 65A, 65B (FIG. 6B) respectively. The thinner inner layers 62A, 62B are coupled to the outer layers 65A, 65B and have a magnetization M1', M2' represented by vectors 66A, 66B (FIG. 6B) respectively opposite the magnetization vectors 65A, 65B of the outer layers 64A, 64B.

As described above, the presence of the current density bias $J_b$ in the conductive spacer 11, creates a magnetic field (not shown) about the VGMR stack. Thus the magnetization vectors 65A, 65B of the outer layers 64A, 64B orient themselves in the direction of the magnetic flux (not shown). Since the inner SAF layers 62A, 62B are oriented antiparallel, the magnetization vectors 66A, 66B will orient themselves opposite the vectors 65A, 65B respectively. The outer layers 64A, 64B have a greater magnetization than the inner layers 62A, 62B, due to the fact that they are thicker SAF layers. Thus there is a net magnetization of $M_1$ and $M_1'$ in the direction of the $M_1$ vector 65A. Similarly there is a net magnetization of $M_{12}$ and $M_2'$ in the direction of the $M_2$ vector 65B.

Figure 6C:
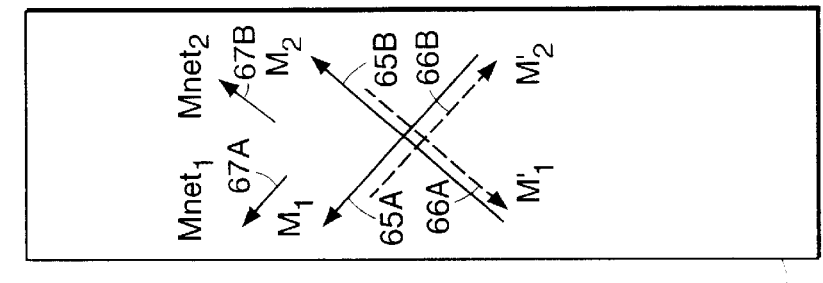
FIG. 6C is a side view of the enhanced differential VGMR stack of FIG. 6A.
Figure 6B:
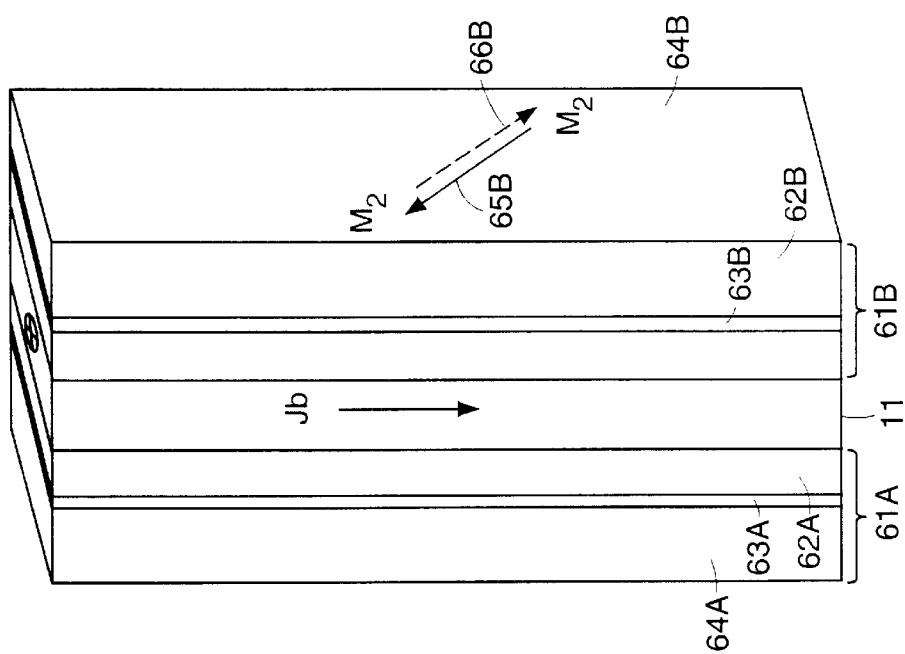
FIG. 6B is a perspective view of the enhanced differential VGMR stack of FIG. 6A.

FIG. 6C depicts a side view of the VGMR sensor 60 showing the orientations of the magnetizations 65A, 65B, 66A, 66B. Net magnetization $M_{net1}$, $M_{net2}$ vectors 67A, 67B are shown.

Figure 7B:
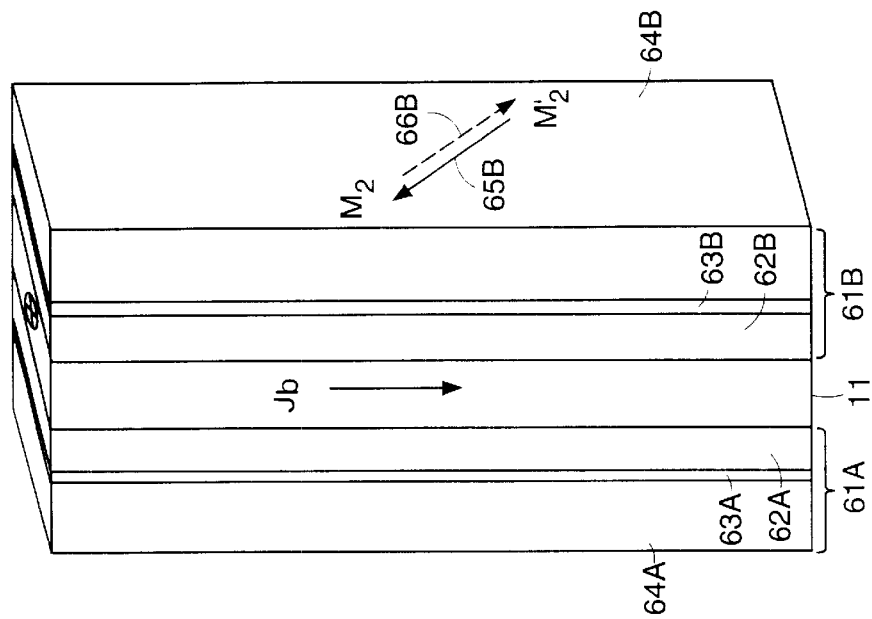
FIG. 7B is a perspective view of the enhanced differential VGMR stack of FIG. 7A.
Figure 7A:
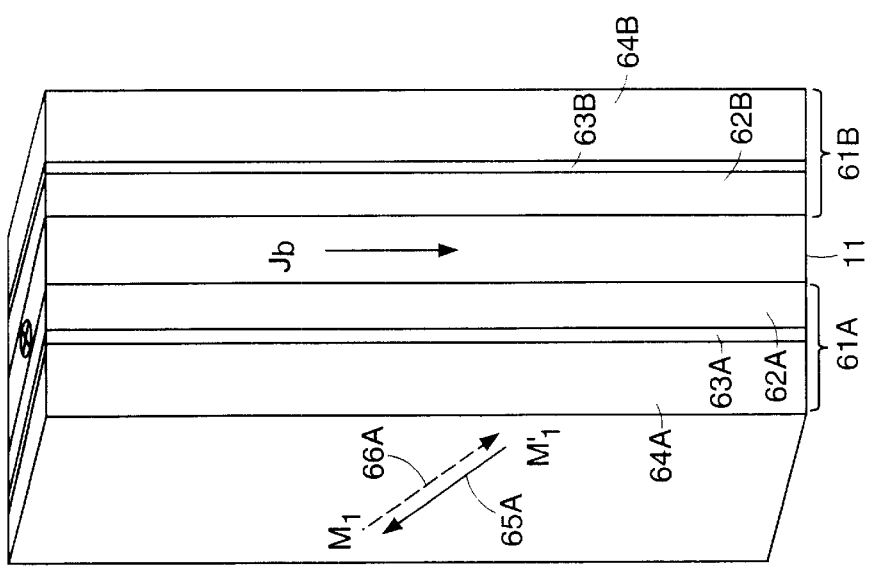
FIG. 7A is a perspective view of a enhanced differential VGMR stack.

Referring now to FIG. 7A, in another implementation of the invention, the inner layers 62A, 62B of the SAF arrangements 61A, 61B are made thicker than the outer layers 64A, 64B. In this configuration, since the inner layers 62A, 62B are thicker, the magnetization vectors 66A, 66B will be larger than the magnetic vectors 65A, 65B (FIG. 7B) of the outer layers 64A, 64B (FIG. 7B), thereby creating a net magnetization in the direction of $M_1'$ and $M_2'$ (FIG. 7B) respectively.

Figure 7D:
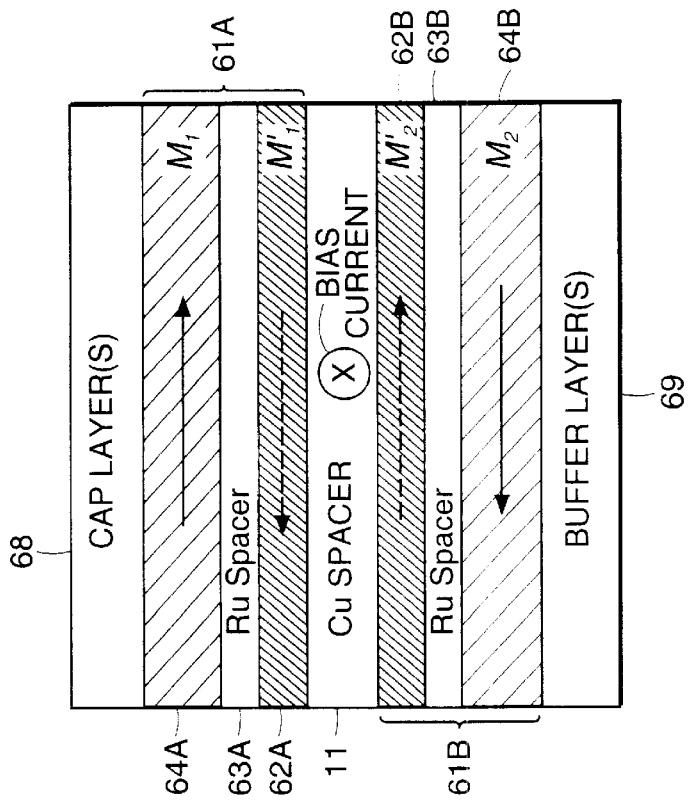
FIG. 7D is a view of the enhanced differential VGMR stack of FIG. 7A.

FIG. 7D depicts an implementation of VGMR sensor 70 having a cap layer 68 and a buffer layer 69. Cap layer 68 is typically Ta and has an approximate thickness of 35 A. Buffer layer is typically Ta in the range of 30–40 A or NiFeCr in the range of 25–50 A. Magnetic layers 64A, 64B are typically NiFeCo or NiFe are in the range of 40–60 A. Nonmagnetic spacer layers 63A, 63B are typically Ru and are in the range of 7–10 A. The inner magnetic layers 62A, 62B are typically NiFeCo, NiFe, CoFe or some combination and are in the range of 15–40 A. The Cu conductive spacer 11 is typically 25–40 A.

Figure 7C:
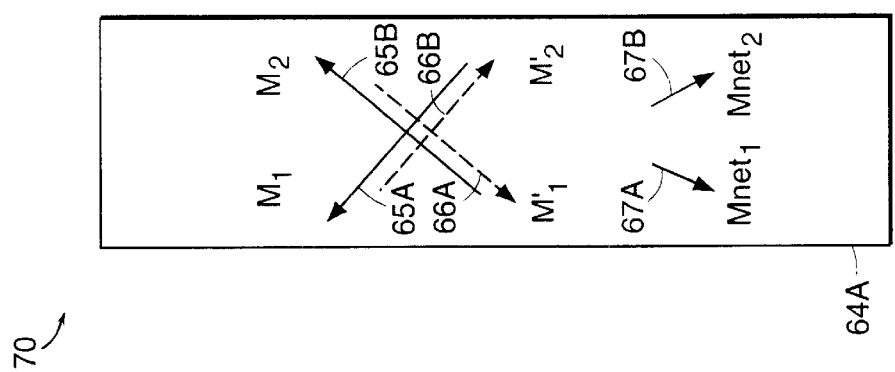
FIG. 7C is a side view of the enhanced differential VGMR stack of FIG. 7A.

FIG. 7C depicts a side view of the VGMR sensor 70 showing the orientations of the magnetizations 65A, 65B, 66A, 66B. Net magnetization $M_{net1}$, $M_{net2}$ vectors 67A, 67B are shown. As compared to FIGS. 6A, 6B, and 6C the net magnetizations 67A, 67B are oriented in the opposite directions.

Figure 8A:
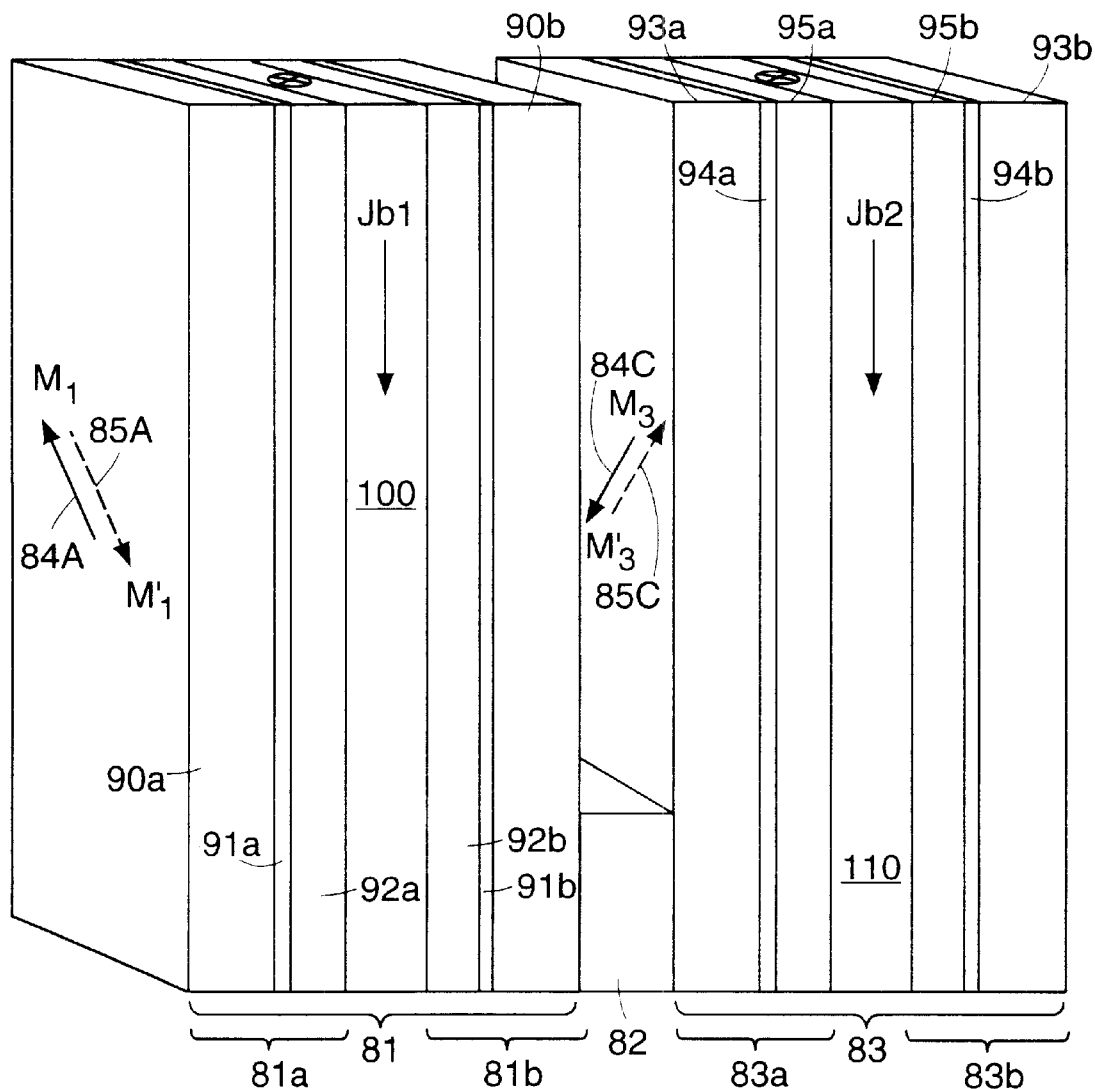
FIG. 8A is a perspective view of an implementation of a folded differential VGMR sensor utilizing two folded Differential VGMR stacks.

Referring now to FIG. 8A, a folded differential VGMR 80 sensor is shown combining the VGMR stacks similar to the stacks depicted in FIGS. 6A and 7A. A first VGMR stack 81 and a second VGMR stack 83 sandwich a nonmagnetic spacer 82. With the magnetization in the first stack 81 oriented in one direction and the magnetization in the second stack 83 oriented in the opposite direction, a differential signal can be obtained. Each of the VGMR stacks 81 and 83 two SAF layers 81a, 81b and 83a, 83b respectively. The SAF layers include non magnetic spacers 91a, 91b, 94a, 94b which is sandwiched by individual SAF layers 90a, 92a, 90b, 92b, 93a, 95a, 93b, 95b. Each of the SAF pairs, 90a and 92a, 90b and 92b, 93a and 95a and 93b and 95b are strongly antiparallel coupled. The magnetization vectors $M_1$ and $M_1'$, $M_2$ and $M_2'$, $M_3$ and $M_3'$, $M_4$ and $M_4'$ are oriented antiparallel as shown in FIGS. 8A and 8B.

As described above with respect to FIGS. 6A–7C, the presence of bias currents $J_{b1}$ and $J_{b2}$, through conductive spacers 100 and 110, creates a magnetic field in which the magnetization vectors attempt to align themselves creating net magnetizations as discussed below.

Figure 8B:
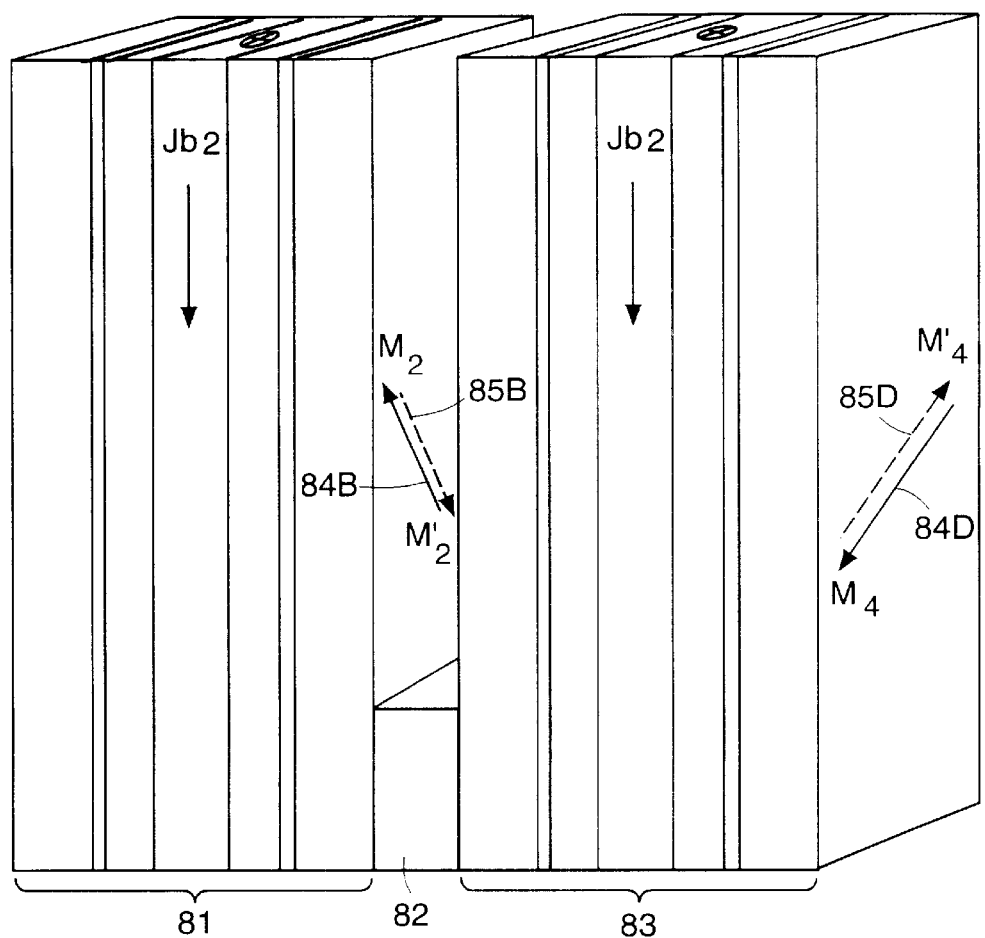
FIG. 8B is a perspective view of another implementation of a folded differential VGMR sensor utilizing two enhanced differential VGMR stacks.

FIG. 8B is another perspective view of the differential VGMR sensor 80 shown in FIG. 8A.

Figure 8D:
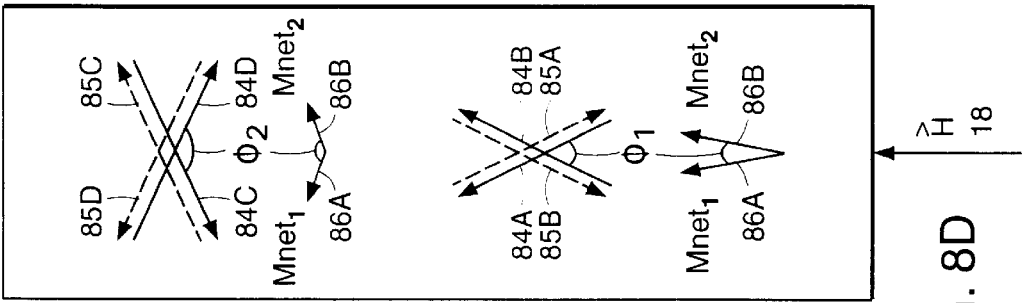
FIG. 8D is a side view of the folded differential VGMR sensor of FIG, 8A in the presence of a magnetic intensity.
Figure 8C:
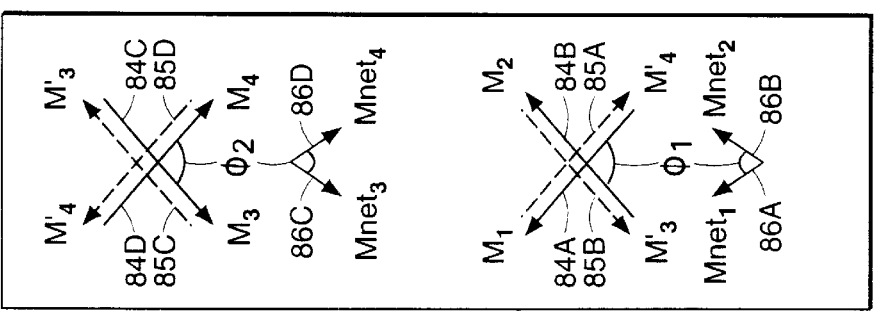
FIG. 8C is a side view of the folded differential VGMR sensor of FIG. 8A.

FIG. 8C depicts aside view of the folded differential VGMR sensor 80. This view of the sensor 80 shows the relative orientations of the magnetization vectors 84A, 84B, 84C, 84D, 85A, 85B, 85C, 85D in the presence of bias currents (not shown). Also depicted are net Magnetization vectors, $M_{net1}$, $M_{net2}$, $M_{net3}$, $M_{net4}$ 86A, 86B, 86C, 86D respectively. As seen in the figure there is scissoring of the magnetization vectors.

Referring now to FIG. 8D, a side view of the folded differential VGMR sensor is shown in the presence of a magnetic intensity H represented by vector 18. With a magnetic field vector 18 perpendicular to the ABS (not shown) of the magnetic medium not shown), the scissoring between $M_{net1}$ and $M_{net2}$ in the first sensor has decreased, and the scissoring between $M_{net3}$ and $M_{net4}$ has increased in the second stack. In the first stack the angle $\phi_1$ between the two magnetization vectors 86A, 86B will decrease while the angle $\phi_2$ in between the magnetization vectors 86C, 86D in the second sensor will increase. In the implementation shown in the diagrams, the first VGMR sensor 81 will increase the resistance as the magnetization vectors 86A, 86B align with the magnetic vector 18. In contrast, although the magnetization vectors 86C, 86D in the second VGMR stack 83 are attempting to align with the magnetic vector 18, they are actually moving farther out of alignment, therefore the resistance will decrease. As a result there will be a differential signal produced by the stacks. Since the layers are experiencing an opposite resistance change, the differential signal will be large in comparison to stacks that are experience a corresponding resistance change. Therefore the signal will be further removed from the noise floor, thereby increasing the sensitivity of the VGMR stack.

A number of embodiments of the present invention have been described. Nevertheless, it will be understood that various modifications may be made without departing from the spirit and scope of the invention. Accordingly, other embodiments are within the scope of the following claims.

What is claimed is:

1. An apparatus for reading data comprising:
   a first magnetoresistive element;
   a second magnetoresistive element formed substantially parallel to the first magnetoresistive element;
   a nonmagnetic single spacer adjacent to both the first and second magnetoresistive elements;
   wherein the first and second magnetoresistive elements are comprised of:
      a first magnetic layer;
      a second magnetic layer formed substantially parallel to the first magnetic layer;
      a permanent magnet formed between the first and second magnetoresistive elements and adjacent the nonmagnetic spacer; and
      a conductive spacer interposed between the first and second magnetic layers, wherein a bias current applied to the conductive spacer of the first magnetoresistive element is substantially equal to a bias current applied to the conductive spacer of the second magnetoresistive element.

2. The apparatus of claim 1 further comprising a permanent magnet formed between the first and second magnetoresistive elements and adjacent the nonmagnetic spacer.

3. The apparatus of claim 2 further comprising a current strip formed between the first and second magnetoresistive elements and in between the nonmagnetic spacer and the permanent magnet.

4. The apparatus of claim 1 wherein the first magnetic layer of at least one of the first and second magnetoresistive elements is comprised of:
   a first magnetic material;
   a second magnetic material;
   a spacing material interposed between the first and second magnetic materials.

5. The apparatus of claim 4 wherein the first and second magnetic materials are comprised of synthetic antiferromagnetics.

6. The apparatus of claim 4 wherein the spacing material is ruthenium.

7. The apparatus of claim 4 wherein the second magnetic layer of at least one of the first and second magnetoresistive elements is comprised of:
   a first magnetic material;
   a second magnetic material;
   a spacing material interposed between the first and second magnetic materials.

8. The apparatus of claim 1 wherein the first magnetic layer is a single layer.

9. The apparatus of claim 9 wherein the single layer is comprised of at least one of NiFe, CoFe, and NiFeCo.

10. The apparatus of claim 1 wherein the first magnetic layer is a bilayer.

11. The apparatus of claim 1 further comprising:
    a first thin layer adjacent interposed between the first magnetic layer and the conductive spacer; and
    a second thin layer interposed between the second magnetic layer and the conductive spacer.

12. The apparatus of claim 11 wherein the first and second thin layers are comprised of at least one of Co and CoFe.

13. A vertical giant magnetoresistive (VGMR) sensor, comprising:
    a first VGMR stack;
    a second VGMR stack;
    a nonmagnetic and nonconductive single spacer adjacent to both the first and second VGMR stacks; and
    a permanent magnet formed between the first and second VGMR stack and adjacent the spacer.

14. The VGMR sensor of claim 13 wherein each of the first and second VGMR stacks comprises:
    a first synthetic antiferromagnetic (SAF) stack;
    a second SAF stack; and
    a conductive spacer interposed between the first and second SAF stacks.

15. The VGMR sensor of claim 14 wherein each of the first and second SAF stacks comprises:
    a first SAF layer;
    a second SAF layer; and
    a spacer layer interposed between the first and second SAF layers.

16. The VGMR sensor of claim 14 wherein the conductive spacer is copper.

17. The VGMR sensor of claim 13 further comprising a current source to apply a first bias current to the first VGMR stack and a second bias current to the second VGMR stack.

18. The VGMR sensor of claim 17 further comprising:
   a differential amplifier for summing the first and second bias currents; and
   a detector for detecting changes in the first and second magnetizations.

19. The VGMR sensor of claim 13 further comprising a current strip formed between the first and second magnetoresistive elements and in between the spacer and permanent magnet.

* * * * *

UNITED STATES PATENT AND TRADEMARK OFFICE
CERTIFICATE OF CORRECTION

PATENT NO. : 6,556,388 B1 Page 1 of 1
DATED : April 29, 2003
INVENTOR(S) : Everitt et al.

It is certified that error appears in the above-identified patent and that said Letters Patent is hereby corrected as shown below:

<u>Title page,</u>
Item [60], Related U.S. Application Data, please change "60,109,288" to
-- 60,109,228 --

Signed and Sealed this

Fourth Day of May, 2004

JON W. DUDAS
*Acting Director of the United States Patent and Trademark Office*